United States Patent
Chen et al.

(10) Patent No.: US 11,683,052 B2
(45) Date of Patent: *Jun. 20, 2023

(54) DATA PROCESSING METHOD AND DEVICE

(71) Applicant: ZTE Corporation, Guangdong (CN)

(72) Inventors: Mengzhu Chen, Guangdong (CN); Jin Xu, Guangdong (CN); Jun Xu, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/468,606

(22) Filed: Sep. 7, 2021

(65) Prior Publication Data

US 2021/0409039 A1   Dec. 30, 2021

Related U.S. Application Data

(63) Continuation of application No. 16/542,246, filed on Aug. 15, 2019, now Pat. No. 11,121,724, which is a
(Continued)

(30) Foreign Application Priority Data

Feb. 15, 2017  (CN) .......................... 201710081996.7
Mar. 24, 2017  (CN) .......................... 201710184062.6

(51) Int. Cl.
*H04W 28/04*   (2009.01)
*H03M 13/15*   (2006.01)
(Continued)

(52) U.S. Cl.
CPC .......... *H03M 13/151* (2013.01); *H03M 13/09* (2013.01); *H04L 1/0003* (2013.01); *H04L 1/0013* (2013.01)

(58) Field of Classification Search
CPC ... H04L 1/0003; H04L 1/0013; H04L 1/0068; H04L 1/0067; H04L 1/0057;
(Continued)

(56) References Cited

U.S. PATENT DOCUMENTS 9,917,675 B2 * 3/2018 Kudekar ............. H03M 13/098
9,973,302 B2   5/2018 Shen et al.
(Continued)

FOREIGN PATENT DOCUMENTS

CN   104539393 A    4/2015
CN   105164959 A   12/2015
(Continued)

OTHER PUBLICATIONS

Communication pursuant to Article 94(3) EPC for European Application No. 18754604.9, filed on Feb. 14, 2018 (7 pages).
(Continued)

*Primary Examiner* — Man U Phan
(74) *Attorney, Agent, or Firm* — Perkins Coie LLP

(57) ABSTRACT

Provided are a data processing method and device. The data processing method includes: performing Polar code encoding on an input bit sequence having a length of K bits to obtain an encoded bit sequence having a length of N bits, and determining a bit sequence to be transmitted from the encoded bit sequence according to a data characteristic of an information bit sequence and a predetermined rate matching scheme. K is a positive integer and N is a positive integer greater than or equal to K.

9 Claims, 1 Drawing Sheet

Related U.S. Application Data continuation of application No. PCT/CN2018/076793, filed on Feb. 14, 2018.

(51) Int. Cl.
*H03M 13/09* (2006.01)
*H04L 1/00* (2006.01)

(58) Field of Classification Search
CPC ...... H04L 1/0071; H04L 1/00; H03M 13/151; H03M 13/09; H03M 13/13; H03M 13/6362; H03M 13/15; H04W 28/04
USPC .......................................................... 370/329
See application file for complete search history.

(56) References Cited

U.S. PATENT DOCUMENTS

| | | | |
|---|---|---|---|
| 10,084,569 B2 | 9/2018 | Xu et al. | |
| 10,224,966 B2* | 3/2019 | Li | H03M 13/09 |
| 10,320,522 B2* | 6/2019 | Jeong | H03M 13/13 |
| 10,348,451 B2* | 7/2019 | Kudekar | H04L 1/0061 |
| 10,355,822 B2* | 7/2019 | Patel | H04L 1/0041 |
| 10,389,483 B2 | 8/2019 | Shen et al. | |
| 10,454,499 B2* | 10/2019 | Richardson | H03M 13/616 |
| 10,516,417 B2 | 12/2019 | Shen et al. | |
| 10,581,462 B2 | 3/2020 | Ge et al. | |
| 10,644,836 B2* | 5/2020 | Kudekar | H03M 13/13 |
| 10,659,194 B2* | 5/2020 | Wang | H04L 1/0058 |
| 10,686,473 B2 | 6/2020 | Jeong et al. | |
| 10,693,503 B2* | 6/2020 | Shin | H03M 13/2792 |
| 11,012,185 B2* | 5/2021 | Jeong | H04L 1/0013 |
| 11,088,708 B2* | 8/2021 | Huang | H03M 13/2906 |
| 11,121,724 B2* | 9/2021 | Chen | H04L 1/00 |
| 11,165,438 B2* | 11/2021 | Kamiya | H03M 13/6516 |
| 11,165,535 B2* | 11/2021 | Wang | H03M 13/13 |
| 11,211,947 B2* | 12/2021 | Qiao | H04W 76/11 |
| 11,233,530 B2* | 1/2022 | Wu | H04W 72/0446 |
| 11,251,904 B2* | 2/2022 | Zhou | H03M 13/13 |
| 11,258,463 B2* | 2/2022 | Luo | H03M 13/616 |
| 11,432,186 B2* | 8/2022 | Zhang | H04L 1/0057 |
| 11,438,100 B2* | 9/2022 | Wu | H03M 13/635 |
| 2014/0173376 A1 | 6/2014 | Jeong et al. | |
| 2016/0013810 A1 | 1/2016 | Gross et al. | |
| 2016/0164629 A1 | 6/2016 | Ahn et al. | |
| 2016/0182187 A1 | 6/2016 | Kim et al. | |
| 2016/0241355 A1 | 8/2016 | Mahdavifar et al. | |
| 2016/0352464 A1 | 12/2016 | Shen et al. | |
| 2017/0019214 A1 | 1/2017 | Shen et al. | |
| 2017/0047947 A1 | 2/2017 | Hong et al. | |
| 2017/0353267 A1* | 12/2017 | Kudekar | H04L 1/0061 |
| 2018/0367239 A1* | 12/2018 | Jang | H04L 1/0013 |
| 2019/0349839 A1 | 11/2019 | Huang et al. | |
| 2019/0372599 A1 | 12/2019 | Chen et al. | |
| 2020/0076534 A1* | 3/2020 | Wang | H04L 1/0045 |
| 2020/0145023 A1* | 5/2020 | Qiao | H04L 1/00 |
| 2020/0274642 A1* | 8/2020 | Wang | H04L 1/0057 |
| 2022/0109524 A1* | 4/2022 | Wang | H04L 1/0043 |

FOREIGN PATENT DOCUMENTS

| | | |
|---|---|---|
| CN | 105306165 A | 2/2016 |
| CN | 105337697 A | 2/2016 |
| CN | 105871506 A | 8/2016 |
| CN | 105900365 A | 8/2016 |
| IN | 201501547 | 1/2016 |
| WO | 2014/059780 A1 | 4/2014 |
| WO | 2014/075419 A1 | 5/2014 |
| WO | 2015/149225 A1 | 10/2015 |
| WO | 2016/101089 A1 | 6/2016 |

OTHER PUBLICATIONS

Extended Search Report dated Jan. 30, 2020 for European Application No. 18754604.9, filed on Feb. 14, 2018 (7 pages).
Indian Office Action dated Jan. 21, 2021 for Indian Patent Application No. 201937036816, filed on Feb. 14, 2018 (7 pages).
Intel, "Considerations in Polar code design," 3GPP TSG RAN WG1 Ad hoc, Spokane, USA, R1-1700385, 4 pages, Jan. 16-20, 2017.
Intel Corporation, "Polar code design", 3GPP TSG RAN WG1 Ad hoc, Spokane, United States of America, R1-1700386, 12 pages, Jan. 2017.
International Search Report and Written Opinion dated May 4, 2018 for International Application No. PCT/CN2018/076793, filed on Feb. 14, 2018 (13 pages).
Japanese Office Action dated Nov. 4, 2020 for Japanese Patent Application No. 2019-544003, filed on Feb. 14, 2018 (9 pages).
Korean Office Action dated Jan. 18, 2021 for Korean Patent Application No. 10-2019-7026787, filed on Feb. 14, 2018 (5 pages).
Korean Office Action dated Jul. 1, 2020 for Korean Patent Application No. 10-2019-7026787, filed on Feb. 14, 2018 (8 pages).
Nokia et al., "Polar codes design for UL control", 3GPP TSG-RAN WG1#NR Ad-Hoc meeting, Spokane, Washington, U.S.A, R1-1701033, 5 pages, Jan. 16, 2017.
Samsung, "Discussion on CA-Polar and PC-Polar Codes", 3GPP TSG RAN WG1 Ad-hoc, Spokane, Washington, U.S.A., R1-1700979, 9 pages, Jan. 16, 2017.
ZTE et al., "Performance evaluation of polar codes for eMBB", 3GPP TSG RAN WG1 Meeting #88, Athens, Greece, R1-1701604, 5 pages, Feb. 2017.
Huawei et al., "On latency and complexity," 3GPP TSG RAN WG1 Meeting #85, Nanjing, China, R1-164040, 7 pages, May 23-27, 2016.
Huawei et al., "Summary of polar code design for control channels," 3GPP TSG RAN WG1 Ad-Hoc Meeting, Spokane, USA, R1-1700088, 10 pages, Jan. 16-20, 2017.
Huawei et al., "Channel coding for very small control block lengths," 3GPP TSG RAN WG1 NR Ad-Hoc Meeting, Spokane, USA, R1-1700091, 7 pages, Jan. 16-20, 2017.
Huawei et al., "Parity-Check polar and CRC-aided polar evaluation," 3GPP TSG RAN WG1 Meeting #88, Athens, Greece, R1-1701701, 10 pages, Feb. 13-17, 2017.
Nokia et al., "Polar design for control channels," 3GPP TSG RAN WG1 Meeting #88, Athens, Greece, R1-1703106, 10 pages, Feb. 13-17, 2017.
Nokia et al., "Polar design for control channels," 3GPP TSG RAN WG1 Meeting #88, Athens, Greece, R1-1704008, 10 pages, Feb. 13-17, 2017.
Korean Office Action dated Dec. 17, 2021 for Korean Patent Application No. 10-2021-7025220, filed on Feb. 14, 2018 (4 pages).
Chinese Office Action dated Aug. 17, 2021 for Chinese Patent Application No. 201710184062.6, filed on Mar. 24, 2017 (14 pages).
Chinese Notice to Grant dated Jan. 21, 2022 for Chinese Patent Application No. 201710184062.6, filed on Mar. 24, 2017 (4 pages).
NTT Docomo, "Discussion on Polar codes design," 3GPP TSG RAN WG1 NR Ad-Hoc Meeting, Spokane, US, R1-1700867, Jan. 16-20, 2017, 7 pages.
Japanese Decision of Patent dated Feb. 14, 2023 for Japanese Patent Application No. 2021-172802, filed on Oct. 22, 2021 (5 pages).
Zte et al., "Performance evaluation of PC Polar Codes and CA Polar codes for eMBB," 3GPP TSG RAN WG1 Meeting #88-Bis R1-1704383, Spokane, USA, Apr. 3-7, 9 pages.

\* cited by examiner

DATA PROCESSING METHOD AND DEVICE

CROSS REFERENCE TO RELATED APPLICATIONS

This application is a continuation of and claims priority to U.S. patent application Ser. No. 16/542,246 now U.S. Pat. No. 11,121,724, filed on Aug. 15, 2019, which is a continuation of International Application No. PCT/CN2018/076793, filed on Feb. 14, 2018, which claims the benefit of priority of Chinese Patent Application No. 201710081996.7, filed on Feb. 15, 2017, and Chinese Patent Application No. 201710184062.6, filed on Mar. 24, 2017. The entire content of the before-mentioned patent applications are incorporated by reference as part of the disclosure of this application.

TECHNICAL FIELD

The present disclosure relates to the next generation mobile communication technology and, in particular, to a data processing method and device.

BACKGROUND

Due to the existence of channel noise, the channel encoding service is an independent part of the mobile communication system, and ensures the reliability, accuracy and effectiveness of information transmission.

In the related art, Polar code is a constructive encoding scheme which has been rigorously proved to be able to reach channel capacity, and satisfies requirements of the 5th Generation New Radio Access Technology (5G New RAT) for communication throughput and latency.

A codeword encoded by Polar code may be expressed as $x = u \cdot G_N$, where $u = (u_1, \ldots u_N)$ is composed of information bits and frozen bits, and $G_N = F_2^{\otimes n}$, where $F_2^{\otimes n}$ represents executing n Kronecker product operations on a matrix $F_2$, and $$F_2 = \begin{bmatrix} 1 & 0 \\ 1 & 1 \end{bmatrix}.$$

The length of bit sequence length output by the Polar code encoder is a power of 2, it is unable to select a bit sequence of an arbitrary length from the encoded bit sequence for transmission.

SUMMARY

The present disclosure provides a data processing method and device, which is capable of implementing transmission of bit sequences of any length.

One embodiment of the present disclosure provides a data processing method. The method includes:
performing Polar code encoding on an input bit sequence having a length of K bits to obtain an encoded bit sequence having a length of N bits; and
determining, from the encoded bit sequence, a bit sequence to be transmitted according to a data characteristic of an information bit sequence and a predetermined rate matching scheme.

K is a positive integer and N is a positive integer greater than or equal to K.

In one embodiment, the Polar code encoding includes parity-check Polar code encoding or cyclic redundancy check-aided Polar code encoding.

In one embodiment, the method further includes selecting one of the parity-check Polar code encoding and the cyclic redundancy check-aided Polar code encoding as an encoding method according to the data characteristic.

One embodiment of the present disclosure further provides a data processing method. The method includes:
perform Polar code encoding, by a transmitting terminal, on an input information bit sequence to obtain an encoded bit sequence;
determining, by the transmitting terminal, a bit sequence to be transmitted from the encoded bit sequence according to a data characteristic of an information bit sequence and a predetermined rate matching scheme; and
transmitting, by the transmitting terminal, the determined bit sequence to be transmitted to a receiving terminal.

One embodiment of the present disclosure further provides a data processing device. The device includes a encoding module and a matching module.

The encoding module is configured to perform Polar code encoding on an input bit sequence having the length of K bits to obtain an encoded bit sequence having the length of N bits; and The matching module is configured to determine a bit sequence to be transmitted from the encoded bit sequence according to a data characteristic of an information bit sequence and a predetermined rate matching scheme. K is a positive integer and N is a positive integer greater than or equal to K.

In one embodiment, the Polar code encoding includes parity-check Polar code encoding or cyclic redundancy check-aided Polar code encoding.

In one embodiment, the encoding module is further configured to select one of the parity-check Polar code encoding and the cyclic redundancy check-aided Polar code encoding as the encoding method according to the data characteristic.

One embodiment of the present disclosure further provides a device for implementing the data processing method. The device includes at least a memory and a processor configured to execute executable instructions stored in the memory.

The memory stores a Polar code generation matrix and the following executable instructions: performing Polar code encoding on an input bit sequence having the length of K bits to obtain an encoded bit sequence having the length of N bits, and determining a bit sequence to be transmitted from the encoded bit sequence according to a data characteristic of an information bit sequence and a predetermined rate matching scheme.

Alternatively, the memory stores the following executable instructions: performing Polar code encoding on the input bit sequence having the length of K bits to obtain the encoded bit sequence having the length of N bits, and determining the bit sequence to be transmitted from the encoded bit sequence according to the data characteristic of the information bit sequence and the predetermined rate matching scheme. K is a positive integer and N is a positive integer greater than or equal to K.

One embodiment of the present disclosure further provides a computer-readable storage medium configured to store computer-executable instructions for executing any method described above.

According to the data processing method and device in the above embodiments, the Polar code encoding is performed on a bit sequence having the length of K bits to obtain the encoded bit sequence having the length of N bits, and the bit sequence to be transmitted is determined from the encoded bit sequence according to the data characteristic, thereby implementing the transmission of bit sequences of arbitrary lengths on the basis of the Polar code encoding.

DETAILED DESCRIPTION

Figure 1:
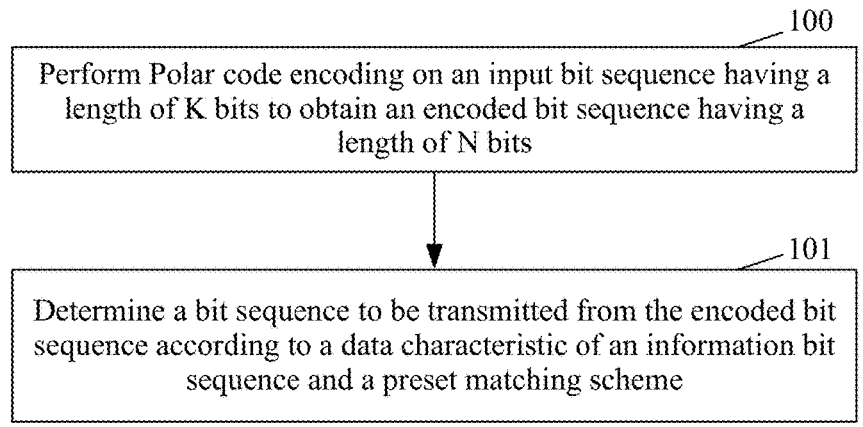
FIG. 1 is a flowchart of a data processing method according to an embodiment of the present disclosure.

FIG. 1 is a flowchart of a data processing method according to an embodiment of the present disclosure. As shown in FIG. 1, the data processing method includes the steps described below.

In step 100, Polar code encoding is performed on an input bit sequence having the length of K bits to obtain an encoded bit sequence having the length of N bits, where K is a positive integer and N is a positive integer greater than or equal to K.

Alternatively, the bit sequence having the length of K bits includes one of:

an information bit sequence;

an information bit sequence and a check bit sequence;

an information bit sequence and a predetermined bit sequence; or an information bit sequence, a check bit sequence and a predetermined bit sequence.

Alternatively, the check bit sequence is obtained by encoding the information bit sequence and the predetermined bit sequence, or the check bit sequence is obtained by encoding the information bit sequence.

Alternatively, the encoding method includes, but is not limit to, parity check code encoding, cyclic redundancy check code encoding, Bose-Chaudhuri-Hocquenghem (BCH) code encoding, Hamming code encoding, convolutional code encoding, generation matrix encoding, Turbo code encoding, low-density parity-check code encoding, Reed Muller code encoding and Hash code encoding. Optionally, the encoding method is any combination of encoding schemes described above or one of the encoding methods performed once or multiple times.

Alternatively, the predetermined bit sequence includes, but is not limited to, an all-zeroes bit sequence, an all-ones bit sequence, or a pseudo random sequence composed of 0s and 1s. Alternatively, the predetermined bit sequence may be a combination of the above schemes.

Alternatively, the predetermined bit sequence includes one or any combination of the following sequences: an all-zeroes bit sequence, an all-ones bit sequence composed, a pseudo random sequence composed of 0s and 1s, a sequence in which a part of the predetermined bit sequence is composed of 0s and the remaining part of the predetermined bit sequence is composed of a predetermined pseudo random sequence composed of 0s and 1s, a sequence in which a part of the predetermined bit sequence is composed of 1s and the remaining part of a predetermined pseudo random sequence composed of 0s and 1s, and a sequence in which a part of the predetermined bit sequence is composed of 0s, another part of the predetermined bit sequence is composed of 1s and the remaining part of predetermined pseudo random sequence composed of 0s and 1s.

Alternatively, the step 110 may include selecting one or C code blocks for Polar code encoding in a Polar code encoding process according to a data characteristic of an information bit sequence, where C is a positive integer greater than 1.

Alternatively, the number of the code block;

$$C = \left\lceil \frac{K_1}{K_{1max}} \right\rceil \text{ or } C = \left\lceil \frac{N}{N_{max}(1+\Delta)} \right\rceil.$$

In the above formula, $K_1$ is the length of the information bit sequence to be transmitted, $K_{1max}$ is the length of a set maximum information bit sequence, and $N_{max}$ is the maximum size of a generation matrix corresponding to the Polar code, where $K_1$, $K_{1max}$ and $N_{max}$ are positive integers, and $0 \le \Delta \le 2$.

Alternatively, the step of selecting one or C code blocks for Polar code encoding in the above step includes:

determining to use C code blocks to perform the Polar code encoding if the data characteristic of the information bit sequence satisfies a threshold condition; or determining to use one code block to perform the Polar code encoding if the data characteristic of the information bit sequence does not satisfy the threshold condition.

Alternatively, the Polar code encoding in the step 100 includes, but is not limit to, parity-check Polar code encoding or cyclic redundancy check-aided Polar code encoding.

It is to be noted that the parity-check Polar code refers to that in the Polar code encoding process, the generation scheme of check bits in the input bit sequence includes obtaining the information bit encoding through parity-check code encoding, and the cyclic redundancy check-aided Polar code refers to that in the Polar code encoding process, the generation scheme of check bits in the input bit sequence includes obtaining the information bit encoding through cyclic redundancy check code encoding, but does not include parity-check code encoding.

Alternatively, before the step 100, the method may further include selecting the parity-check Polar code encoding or the cyclic redundancy check-aided Polar code encoding as an encoding method according to the data characteristic of the information bit sequence.

Alternatively, the step of selecting the parity-check Polar code encoding or the cyclic redundancy check-aided Polar code encoding as the encoding method according to the data characteristic of the information bit sequence includes: selecting one encoding method from the parity-check Polar code encoding or the cyclic redundancy check-aided Polar code encoding if the data characteristic of the information bit sequence satisfies the threshold condition; or selecting the other encoding method if the data characteristic of the information bit sequence does not satisfy the threshold condition.

Alternatively, the step of performing Polar code encoding on a bit sequence having the length of K bits to obtain an encoded bit sequence having the length of N bits includes: performing Polar code encoding on the input bit sequence having the length of K bits to obtain the encoded bit sequence having the length of N bits according to a Polar code generation matrix.

In step 101, a bit sequence to be transmitted is determined from the encoded bit sequence according to the data characteristic of the information bit sequence and a predetermined rate matching scheme.

The step 101 may include determining a rate matching scheme of the bit sequence to be transmitted from a plurality of predetermined rate matching schemes according to the data characteristic of the information bit sequence; and selecting R bits from the encoded bit sequence as the bit sequence to be transmitted according to the determined rate matching scheme, where R is a positive integer greater than or equal to K.

In one embodiment, the step of determining a rate matching scheme of the bit sequence to be transmitted from a plurality of predetermined rate matching schemes according to the data characteristic of the information bit sequence includes: determining one rate matching scheme from the plurality of predetermined rate matching schemes as the rate matching scheme of the bit sequence to be transmitted if the data characteristic of the information bit sequence satisfies the threshold condition; or determining another one rate matching scheme from the remaining plurality of predetermined rate matching schemes as the rate matching scheme of the bit sequence to be transmitted if the data characteristic of the information bit sequence does not satisfy the threshold condition.

Alternatively, the data characteristic of the information bit sequence includes one or any combination of:

a working mode of the information bit sequence, where the working mode may be an in-band mode, an out-band mode or a standalone mode;

an application scenario of the information bit sequence, where the application scenario may be an enhanced Mobile Broadband (eMBB) scenario, an Ultra Reliability Low Latency (URLLC) scenario, or a massive Machine Type Communication (mMTC) scenario;

a link direction of the information bit sequence, where the link direction may be a downlink direction from a base station or a relay to a terminal, or an uplink direction from the terminal to the base station or the relay;

a type of user equipment (UE) receiving the bit sequence to be transmitted, where the UEs which are different in level (type) are different in the size of the receiving buffer;

a length of the information bit sequence;

a length of the encoded code block;

a code rate of the encoded code block;

a modulation and coding scheme (MCS) of the information bit sequence;

an aggregation level of a control channel element (CCE) carrying the information bit sequence;

a search space corresponding to the information bit sequence;

a scrambling method of the information bit sequence;

transmission times of the information bit sequence;

a type of a channel carrying the information bit sequence, where the type of the channel may be a data channel or a control channel;

a control information format corresponding to the information bit sequence;

a channel state information (CSI) process corresponding to the information bit sequence;

a set of subframes carrying the information bit sequence;

a position index sequence of the information bit sequence and the check bit sequence;

and a carrier frequency carrying the information bit sequence.

Alternatively, the predetermined rate matching scheme (that is, the rate matching scheme according to which R bits are selected from the encoded bit sequence as the bit sequence to be transmitted) may include:

a first rate matching scheme, in which, when R<N, bits whose index is $BRO(i_1)$ in the encoded bit sequence are discarded and the remaining R bits are used as the bit sequence to be transmitted, where $i_1$=0, 1, . . . , N−R−1 and BRO is a bit reversal sequence permutation operation;

a second rate matching scheme, in which, when R<N, bits whose index is $BRO(i_2)$ in the encoded bit sequence are discarded and the remaining R bits are used as the bit sequence to be transmitted, where $i_2$=R, R+1, . . . , N−1 and BRO is a bit reversal sequence permutation operation;

a third rate matching scheme, in which, when R<N, bits whose index is $i_3$ in the encoded bit sequence are discarded and the remaining R bits are used as the bit sequence to be transmitted, where $i_3$=R, R+1, . . . , N−1;

a fourth rate matching scheme, in which, when R<N, N−R bits are discarded from bits whose index is $\{S_1, S_2, S_3\}$ in the encoded bit sequence and the remaining R bits are used as the bit sequence to be transmitted, where $S_1=\{0, 1, \ldots, N_1-1\}$, $S_2=\{N_2, N_3, N_2+1, N_3+1, \ldots, N_4, N_5\}$, $S_3$ is remaining indexes, $N/8 \leq N_1 \leq N_2 \leq N/3$, $N_2 \leq N_4 \leq N_3 \leq 2N/3$, $N_3 \leq N_5 \leq N-1$, $N_1, N_2, N_3, N_4$ and $N_5$ are a positive integer, and the intersection set between any two of the sequence $S_1$, the sequence $S_2$ and the sequence $S_3$ is empty;

a fifth rate matching scheme, in which, when R<N, N−R bits are discarded from bits whose index is $\{Q_3, Q_2, Q_1\}$ in the encoded bit sequence and the remaining R bits are used as the bit sequence to be transmitted, where $Q_1=\{N_1-1, N_1-2, \ldots, 0\}$, $Q_2=\{N_5, N_4, N_5-1, N_4-1, \ldots, N_3, N_2\}$, $Q_3$ is remaining indexes, $N/8 \leq N_1 \leq N_2 \leq N/3$, $N_2 \leq N_4 \leq N_3 \leq 2N/3$, $N_3 \leq N_5 \leq N-1$, $N_1, N_2, N_3, N_4$ and $N_5$ are a positive integer, and a set between any two of the sequence $Q_1$, the sequence $Q_2$ and the sequence $Q_3$ is empty;

a sixth rate matching scheme, in which, when R<N, first R bits in the encoded bit sequence are selected as the bit sequence to be transmitted according to an index sequence $\{I_1, I_2, I_3, I_4\}$, where the sequence $I_1$ is an intersection set of a sequence $\{BRO(k)\}$ and a sequence $\{0, 1, \ldots, t_1-1\}$, the sequence $I_2$ is a difference set of the sequence $\{0, 1, \ldots, t_1-1\}$ and the sequence $I_1$, the sequence $I_3$ is remaining index values, $k=t_2, t_2+1, \ldots, N-1$, BRO is a bit reversal sequence permutation operation, $N/8 \leq t_1 \leq 3N/8$, $0 \leq t_2 N-1$, $t_1$ and $t_2$ are nonnegative integers, and the intersection set between any two of the sequence $I_1$, the sequence $I_2$, the sequence $I_3$ and the sequence $I_4$ is empty;

a seventh rate matching scheme, in which, when R>N, (R−N) bits are selected from a N-bits encoded bit sequence, a R-bits bit sequence are obtained by placing the (R−N) bits before or after the N-bits encoded bit sequence, and using the R-bits bit sequence as the bit sequence to be transmitted;

an eighth rate matching scheme, in which, when R<N, R bits are selected from the N-bits encoded bit sequence as the bit sequence to be transmitted according to first R indexes or last R indexes in an index sequence $P_1$, where the index sequence $P_1$ and a sequence for determining a position of the input bit sequence having the length of K bits in a Polar code encoder is the same sequence, or an arrangement order of at least a proportion of q % of elements in the index sequence $P_1$ is different from an arrangement order of elements of the sequence for determining the position of the input bit sequence having the length of K in the Polar code encoder, where q % may be 5%, 10% or 20%;

a ninth rate matching scheme, in which, when R>N, R−N bits are selected from the encoded bit sequence having the length of N bits according to continuous R−N indexes in the index sequence P1, a bit sequence having the length of R bits is obtained by arranging the R−N bits before or after the encoded bit sequence having the length of N bits, and the bit sequence having the length of R bits is used as the bit sequence to be transmitted, where the index sequence $P_1$ and a sequence for determining a position of an input bit sequence having the length of K bits in a Polar code encoder is the same sequence, or an arrangement order of at least a proportion of q % of elements in the index sequence $P_1$ is different from an arrangement order of elements of the sequence for determining the position of the input bit sequence having the length of K bits in the Polar code encoder, where q % is not greater than 70%, and q % may be 5%, 10% or 20%;

a tenth rate matching scheme, in which, when R<N, first R bits or last R bits are selected from the encoded bit sequence having the length of N bits as the bit sequence to be transmitted, where the encoding process includes: interleaving the a-th input bit in the bit sequence having the length of K bits to a position whose index b of the Polar code encoder, and after encoding, interleaving the c-th bit sequence in the encoded bit sequence having the length of N bits to a position index d of a register, $a=\pi_1(b)$, $c=\pi_2(d)$, $\pi_1$ and $\pi_2$ are the same sequence, $a \in [0, 1, \ldots, k-1]$, $b \in [0, 1, \ldots, N-1]$, $c \in [0, 1, \ldots, N-1]$, and $d \in [0, 1, \ldots, N-1]$, or an arrangement order of at least e % of elements in $\pi_1$ is different from an arrangement order of elements in $\pi_2$ and e % is 5%, 10% or 20%; and an eleventh rate matching scheme, in which, when R>N, R−N continuous bits are selected from the encoded bit sequence having the length of N bits, the R−N bits are arranged before or after the encoded bit sequence having the length of N bits to obtain a bit sequence having the length of R bits, and the bit sequence having the length of R bits is used as the bit sequence to be transmitted, where the encoding process includes: interleaving the a-th input bit in the bit sequence having the length of K bits to a position index b of the Polar code encoder or a generation matrix, and after encoding, interleaving the cth bit sequence in the encoded bit sequence having the length of N bits to a position index d of a register, $a=\pi_1(b)$, $c=\pi_2(d)$, $\pi_1$ and $\pi_2$ are the same sequence, $a \in [0, 1, \ldots, k-1]$, $b \in [0, 1, \ldots, N-1]$, $c \in [0, 1, \ldots, N-1]$, and $d \in [0, 1, \ldots, N-1]$, or an arrangement order of at least e % of elements in $\pi_1$ is different from an arrangement order of elements in $\pi_2$ and e % is 5%, 10% or 20%.

Alternatively, the sequence of the position of the input bit sequence having the length of K bits in the Polar code encoder or the interleaver $\pi_1$ may be obtained by a sequence where indexes i are sorted according to their function values $$\sum_{w=0}^{n-1} B_w * 2^{\frac{w}{k}},$$

where $i \in [0, 1, \ldots, N-1]$, $n=\log_2 N$, $(B_{n-1}, B_{n-2}, \ldots, B_w, \ldots, B_0)$ is a binary representation of the index i, k is a positive integer, and $w \in [0, 1, \ldots, n-1]$.

It is to be noted that the method of performing the BRO bit reversal sequence permutation operation on i to obtain data j=BRO(i) may be: assuming that i and j may be represented by 3-bit binary and i=3=(011), performing a bit reversal sequence arrangement on (011) to obtain (110)=6, that is, j=6.

It is to be noted that in the Polar code encoder or the generation matrix, the position of the input bit sequence (including the information bit, the check bit and the predetermined bit) needs to be properly arranged, that is a good subchannel or a reliable index position needs to be selected for the information bit and the check bit so as to obtain better code performance. For any index, an arrangement position of the index in the index sequence $P_1$, the interleaver $\pi_1$ or the interleaver $\pi_2$ characterizes the reliability of the index.

It is to be noted that the operation of obtaining the sequence in which the indexes i are sorted according to their function values $$f(i) = \sum_{m=0}^{n} B_m * 2^{\frac{j}{k}}$$

is as follow: assuming k=4, N=16 and n=log$_2$(16)=4, when the index i=3, one may get $(B_3, B_2, B_1, B_0)=(0011)$ through calculation, and then, $f(i)=f(3)=1*2^{(0*(1/4))}+1*2^{(1*(1/4))}+0*2^{(2*(1/4))}+0*2^{(3*(1/4))}=2.1892$. Similarly, for $i \in [0, 1, \ldots, 15]$, one may get $[f(0), f(1), \ldots, f(15)]=[0, 1, 1.1892, 2.1892, 1.4142, 2.4142, 2.6034, 3.6034, 1.6818, 2.6818, 2.8710, 3.8710, 3.0960, 4.0960, 4.2852, 5.2852]$ through calculation and obtain a sequence [0, 1, 2, 4, 8, 3, 5, 6, 9, 10, 12, 7, 11, 13, 14, 15] by sorting $[f(0), f(1), \ldots, f(15)]$ from small to large.

In one embodiment, when the data characteristic of the information bit sequence is the aggregation level of the control channel element (CCE) carrying the information bit sequence, the rate matching scheme according to which the bit sequence to be transmitted is determined in the step 101 is as follows.

When the aggregation level of the CCE carrying the information bit sequence is not greater than (less than or equal to) a preset first threshold, the rate matching scheme of the bit sequence to be transmitted may be: the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the aggregation level of the CCE carrying the information bit sequence is greater than the first threshold, the rate matching scheme of the bit sequence to be transmitted may be: the first rate matching scheme, the fourth rate matching scheme or the sixth rate matching scheme. The value of the first threshold is 1, 2, 4 or 8.

In one embodiment, when the data characteristic of the information bit sequence is the MCS level of the information bit sequence, the rate matching scheme according to which the bit sequence to be transmitted is determined in the step 101 is as follows.

When the MCS level of the information bit sequence is greater than a preset second threshold, the rate matching scheme of the bit sequence to be transmitted may be the second rate matching scheme, the third rate matching scheme, the fifth rate matching scheme, the eighth rate matching scheme or the tenth rate matching scheme. When the MCS level of the information bit sequence is less than or equal to the second threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme. The second threshold may be a positive integer which is not less than 2 and not greater than 32.

In one embodiment, when the data characteristic of the information bit sequence is the working mode of the information bit sequence, the rate matching scheme according to which the bit sequence to be transmitted is determined in the step 101 is as follows.

When the working mode is the in-band mode or the stand alone mode, the rate matching scheme of the bit sequence to be transmitted may be the second rate matching scheme, the third rate matching scheme, the fifth rate matching scheme, the eighth rate matching scheme or the tenth rate matching scheme. When the working mode is the out-band mode, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme.

In one embodiment, when the data characteristic of the information bit sequence is the application scenario of the information bit sequence, the rate matching scheme according to which the bit sequence to be transmitted is determined in the step 101 is as follows.

When the application scenario is the enhanced Mobile Broadband scenario, the rate matching scheme of the bit sequence to be transmitted may be the second rate matching scheme, the third rate matching scheme, the fifth rate matching scheme, the eighth rate matching scheme or the tenth rate matching scheme. When the application scenario is the Ultra Reliability Low Latency scenario or the massive Machine Type Communication scenario, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme.

In one embodiment, when the data characteristic of the information bit sequence is the link direction of the information bit sequence, the rate matching scheme according to which the bit sequence to be transmitted is determined in the step 101 is as follows.

When the link direction is the uplink direction from the terminal to the base station or the relay, the rate matching scheme of the bit sequence to be transmitted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the link direction is the downlink direction from the base station or the relay to the terminal, the rate matching scheme of the bit sequence to be transmitted may be the first rate matching scheme, the fourth rate matching scheme or the sixth rate matching scheme.

In one embodiment, when the data characteristic of the information bit sequence is the type of the user equipment receiving the bit sequence to be transmitted, the rate matching scheme according to which the bit sequence to be transmitted is determined in the step 101 is as follows.

When an index of the type of the user equipment is greater than a preset third threshold, the rate matching scheme of the bit sequence to be transmitted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the index of the type of the user equipment is less than or equal to the third threshold, the rate matching scheme of the bit sequence to be transmitted may be the first rate matching scheme, the fourth rate matching scheme or the sixth rate matching scheme. The third threshold may be a positive integer greater than 6.

In one embodiment, when the data characteristic of the information bit sequence is the length of the encoded code block, the rate matching scheme according to which the bit sequence to be transmitted is determined in the step 101 is as follows.

When the length of the encoded code block is greater than a preset fourth threshold, the rate matching scheme of the bit sequence to be transmitted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the length of the encoded code block is less than or equal to the fourth threshold, the rate matching scheme of the bit sequence to be transmitted may be the first rate matching scheme, the fourth rate matching scheme or the sixth rate matching scheme. The fourth threshold may be a positive integer which is not less than 200 and not greater than 4000.

In one embodiment, when the data characteristic of the information bit sequence is the length of the information bit sequence, the rate matching scheme according to which the bit sequence to be transmitted is determined in the step 101 is as follows.

When the length of the information bit sequence is greater than a preset fifth threshold, the rate matching scheme of the bit sequence to be transmitted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the length of the information bit sequence is less than or equal to the fifth threshold, the rate matching scheme of the bit sequence to be transmitted may be the first rate matching scheme, the fourth rate matching scheme or the sixth rate matching scheme. The fifth threshold may be a positive integer which is not less than 200 and not greater than 2000.

In one embodiment, when the data characteristic of the information bit sequence is the code rate of the encoded code block, the rate matching scheme according to which the bit sequence to be transmitted is determined in the step 101 is as follows.

When the code rate of the encoded code block is greater than a preset sixth threshold, the rate matching scheme of the bit sequence to be transmitted may be the second rate matching scheme, the third rate matching scheme, the fifth rate matching scheme, the eighth rate matching scheme or the tenth rate matching scheme. When the code rate of the encoded code block is less than or equal to the sixth threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme. The sixth threshold is not less than $\frac{1}{3}$ and not greater than $\frac{1}{2}$.

In one embodiment, when the data characteristic of the information bit sequence is the search space, the rate matching scheme according to which the bit sequence to be transmitted is determined in the step 101 is as follows.

When the search space is a UE-specific search space, the rate matching scheme of the bit sequence to be transmitted may be the second rate matching scheme, the third rate matching scheme, the fifth rate matching scheme, the eighth rate matching scheme or the tenth rate matching scheme. When the search space is a common search space, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme.

In one embodiment, when the data characteristic of the information bit sequence is the number of transmissions of the information bit sequence, the rate matching scheme according to which the bit sequence to be transmitted is determined in the step 101 is as follows.

When the number of transmissions of the information bit sequence is less than or equal to a preset seventh threshold, the rate matching scheme of the bit sequence to be transmitted may be the second rate matching scheme, the third rate matching scheme, the fifth rate matching scheme, the eighth rate matching scheme or the tenth rate matching scheme. When the number of transmissions of the information bit sequence is greater than the seventh threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme. The seventh threshold may be a positive integer which is not less than 1 and not greater than 4.

In one embodiment, when the data characteristic of the information bit sequence is the type of the channel carrying the information bit sequence, the rate matching scheme according to which the bit sequence to be transmitted is determined in the step 101 is as follows.

When the type of the channel carrying the information bit sequence is a data channel, the rate matching scheme of the bit sequence to be transmitted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the type of the channel carrying the information bit sequence is a control channel, the rate matching scheme of the bit sequence to be transmitted may be the first rate matching scheme, the fourth rate matching scheme or the sixth rate matching scheme.

In one embodiment, when the data characteristic of the information bit sequence is the control information format corresponding to the information bit sequence, the rate matching scheme according to which the bit sequence to be transmitted is determined in the step 101 is as follows.

When an index of the control information format corresponding to the information bit sequence is less than or equal to a preset eighth threshold, the rate matching scheme of the bit sequence to be transmitted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the index of the control information format corresponding to the information bit sequence is greater than the eighth threshold, the rate matching scheme of the bit sequence to be transmitted may be the first rate matching scheme, the fourth rate matching scheme or the sixth rate matching scheme. The eighth threshold may be a nonnegative integer which is not greater than 3.

In one embodiment, when the data characteristic of the information bit sequence is the CSI process corresponding to the information bit sequence, the rate matching scheme according to which the bit sequence to be transmitted is determined in the step 101 is as follows.

When a value of a CQI in the CSI process is greater than a preset ninth threshold, the rate matching scheme of the bit sequence to be transmitted may be the second rate matching scheme, the third rate matching scheme, the fifth rate matching scheme, the eighth rate matching scheme or the tenth rate matching scheme. When the value of the CQI in the CSI process is less than or equal to the ninth threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme. The ninth threshold is a nonnegative integer which is not greater than 15.

In one embodiment, when the data characteristic of the information bit sequence is the scrambling scheme of the information bit sequence, the rate matching scheme according to which the bit sequence to be transmitted is determined in the step 101 is as follows.

When a level of the scrambling scheme is greater than a preset tenth threshold, the rate matching scheme of the bit sequence to be transmitted may be the second rate matching scheme, the third rate matching scheme, the fifth rate matching scheme, the eighth rate matching scheme or the tenth rate matching scheme. When the level of the scrambling scheme is less than or equal to the tenth threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme. The tenth threshold may be a positive integer which is not greater than 3.

In one embodiment, when the data characteristic of the information bit sequence is the set of subframes carrying the information bit sequence, the rate matching scheme according to which the bit sequence to be transmitted is determined in the step 101 is as follows.

When an index of the set of subframes carrying the information bit sequence is greater than a preset eleventh threshold, the rate matching scheme of the bit sequence to be transmitted may be the second rate matching scheme, the third rate matching scheme, the fifth rate matching scheme, the eighth rate matching scheme or the tenth rate matching scheme. When the index of the set of subframes carrying the information bit sequence is less than or equal to the eleventh threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme. The eleventh threshold may be a nonnegative integer which is not greater than 15.

In one embodiment, when the data characteristic of the information bit sequence is the position index sequence of the information bit sequence and the check bit sequence, the rate matching scheme according to which the bit sequence to be transmitted is determined in the step 101 is as follows.

When the position index sequence of the information bit sequence and the check bit sequence is greater than a preset twelfth threshold, the rate matching scheme of the bit sequence to be transmitted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When the position index sequence of the information bit sequence and the check bit sequence is less than or equal to the twelfth threshold, the rate matching scheme of the bit sequence to be transmitted may be the first rate matching scheme, the fourth rate matching scheme or the sixth rate matching scheme. The twelfth threshold may be a positive integer which is not less than 200 and not greater than 4000.

In one embodiment, when the data characteristic of the information bit sequence is the carrier frequency carrying the information bit sequence, the rate matching scheme according to which the bit sequence to be transmitted is determined in the step 101 is as follows.

When the carrier frequency carrying the information bit sequence is less than or equal to a preset thirteenth threshold, the rate matching scheme of the bit sequence to be transmitted may be the second rate matching scheme, the third rate matching scheme, the fifth rate matching scheme, the eighth rate matching scheme or the tenth rate matching scheme. When the carrier frequency carrying the information bit sequence is greater than the thirteenth threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme. The thirteenth threshold is not less than 6 GHz.

In one embodiment, when the data characteristic of the information bit sequence is the aggregation level of the CCE of the information bit sequence and the control information format corresponding to the information bit sequence, the rate matching scheme according to which the bit sequence to be transmitted is determined in the step 101 is as follows.

When the aggregation level of the CCE of the information bit sequence and the control information format corresponding to the information bit sequence satisfy a threshold condition, that is when the aggregation level of the CCE of the information bit sequence is less than or equal to the first threshold and the index of the control information format corresponding to the information bit sequence is less than or equal to the eighth threshold, the rate matching scheme of the bit sequence to be transmitted may be the second rate matching scheme, the third rate matching scheme, the fifth rate matching scheme, the eighth rate matching scheme or the tenth rate matching scheme. When the aggregation level of the CCE of the information bit sequence is greater than the first threshold or when the index of the control information format corresponding to the information bit sequence is greater than the eighth threshold, the rate matching scheme of the bit sequence to be transmitted may be the first rate matching scheme, the fourth rate matching scheme, the sixth rate matching scheme, the seventh rate matching scheme, the ninth rate matching scheme or the eleventh rate matching scheme.

In one embodiment, when the data characteristic of the information bit sequence is the aggregation level of the CCE carrying the information bit sequence, the step of selecting one or C code blocks to perform the Polar code encoding according to the data characteristic includes: when the aggregation level of the CCE carrying the information bit sequence is less than or equal to the preset first threshold, selecting C code blocks for the Polar code encoding; when the aggregation level of the CCE carrying the information bit sequence is greater than the first threshold, selecting one code block for the Polar code encoding.

In one embodiment, when the data characteristic of the information bit sequence is the MCS level of the information bit sequence, the step of selecting one or C code blocks for the Polar code encoding according to the data characteristic includes: when the MCS level of the information bit sequence is greater than the preset second threshold, selecting one code block for the Polar code encoding; when the MCS level of the information bit sequence is less than or equal to the second threshold, selecting C code blocks for the Polar code encoding.

In one embodiment, when the data characteristic of the information bit sequence is the working mode of the information bit sequence, the step of selecting one or C code blocks for the Polar code encoding according to the data characteristic includes: when the working mode is the in-band mode or the stand alone mode, selecting one code block for the Polar code encoding; or when the working mode is the out-band mode, selecting C code blocks for the Polar code encoding.

In one embodiment, when the data characteristic of the information bit sequence is the application scenario of the information bit sequence, the step of selecting one or C code blocks to perform the Polar code encoding according to the data characteristic includes: when the application scenario is the enhanced Mobile Broadband scenario, selecting one code block to perform the Polar code encoding; when the application scenario is the Ultra Reliability Low Latency scenario or the massive Machine Type Communication scenario, selecting C code blocks to perform the Polar code encoding.

In one embodiment, when the data characteristic of the information bit sequence is the link direction of the information bit sequence, the step of selecting one or C code blocks to perform the Polar code encoding according to the data characteristic includes: when the link direction is the downlink direction from the base station or the relay to the terminal, selecting one code block to perform the Polar code encoding; when the link direction is the uplink direction from the terminal to the base station or the relay, selecting C code blocks to perform the Polar code encoding.

In one embodiment, when the data characteristic of the information bit sequence is the type of the user equipment receiving the bit sequence to be transmitted, the step of selecting one or C code blocks to perform the Polar code encoding according to the data characteristic includes: when the index of the type of the user equipment is greater than the preset third threshold, selecting C code blocks to perform the Polar code encoding; when the index of the type of the user equipment is less than or equal to the third threshold, selecting one code block to perform the Polar code encoding.

In one embodiment, when the data characteristic of the information bit sequence is the length of the encoded code block, the step of selecting one or C code blocks to perform the Polar code encoding according to the data characteristic includes: when the length of the encoded code block is greater than the preset fourth threshold, selecting C code blocks to perform the Polar code encoding; when the length of the encoded code block is less than or equal to the fourth threshold, selecting one code block to perform the Polar code encoding.

In one embodiment, when the data characteristic of the information bit sequence is the length of the information bit sequence, the step of selecting one or C code blocks to perform the Polar code encoding according to the data characteristic includes: when the length of the information bit sequence is greater than the preset fifth threshold, selecting C code blocks to perform the Polar code encoding; when the length of the information bit sequence is less than or equal to the fifth threshold, selecting one code block to perform the Polar code encoding. The fifth threshold may be a positive integer which is not less than 200 and not greater than 2000.

In one embodiment, when the data characteristic of the information bit sequence is the code rate of the encoded code block, the step of selecting one or C code blocks to perform the Polar code encoding according to the data characteristic includes: selecting one code block to perform the Polar code encoding when the code rate of the encoded code block is greater than the preset sixth threshold; and selecting C code blocks to perform the Polar code encoding when the code rate of the encoded code block is less than or equal to the sixth threshold.

In one embodiment, when the data characteristic of the information bit sequence is the search space corresponding to the information bit sequence, the step of selecting one or C code blocks to perform the Polar code encoding according to the data characteristic includes: selecting one code block to perform the Polar code encoding when the search space corresponding to the information bit sequence is the UE-specific search space; and selecting C code blocks to perform the Polar code encoding when the search space corresponding to the information bit sequence is the common search space.

In one embodiment, when the data characteristic of the information bit sequence is the number of transmissions of the information bit sequence, the step of selecting one or C code blocks to perform the Polar code encoding according to the data characteristic includes: when the number of transmissions of the information bit sequence is less than or equal to the preset seventh threshold, selecting one code block to perform the Polar code encoding; and when the number of transmissions of the information bit sequence is greater than the seventh threshold, selecting C code blocks to perform the Polar code encoding.

In one embodiment, when the data characteristic of the information bit sequence is the type of the channel carrying the information bit sequence, the step of selecting one or C code blocks to perform the Polar code encoding according to the data characteristic includes: when the type of the channel carrying the information bit sequence is the data channel, selecting C code blocks to perform the Polar code encoding; and when data channel is the control channel, selecting one code block to perform the Polar code encoding.

In one embodiment, when the data characteristic of the information bit sequence is the control information format corresponding to the information bit sequence, the step of selecting one or C code blocks to perform the Polar code encoding according to the data characteristic includes: when the control information format corresponding to the information bit sequence is less than or equal to the preset eighth threshold, selecting one code block to perform the Polar code encoding; and when the control information format corresponding to the information bit sequence is greater than the eighth threshold, selecting C code blocks to perform the Polar code encoding. The eighth threshold is a nonnegative integer which is not greater than 3.

In one embodiment, when the data characteristic of the information bit sequence is the CSI process corresponding to the information bit sequence, the step of selecting one or C code blocks to perform the Polar code encoding according to the data characteristic includes: when the value of the CQI in the CSI process is greater than the preset ninth threshold, selecting one code block to perform the Polar code encoding; and when the value of the CQI in the CSI process is less than or equal to the ninth threshold, selecting C code blocks to perform the Polar code encoding.

In one embodiment, when the data characteristic of the information bit sequence is the scrambling scheme of the information bit sequence, the step of selecting one or C code blocks to perform the Polar code encoding according to the data characteristic includes: when the level of the scrambling scheme is greater than the preset tenth threshold, selecting C code blocks to perform the Polar code encoding; and when the level of the scrambling scheme is less than or equal to the tenth threshold, selecting one code block to perform the Polar code encoding.

In one embodiment, when the data characteristic of the information bit sequence is the set of subframes carrying the information bit sequence, the step of selecting one or C code blocks to perform the Polar code encoding according to the data characteristic includes: when the index of the set of subframes is greater than the preset eleventh threshold, selecting one code block to perform the Polar code encoding; and when the index of the set of subframes is less than or equal to the eleventh threshold, selecting C code blocks to perform the Polar code encoding.

In one embodiment, when the data characteristic of the information bit sequence is the position index sequence of the information bit sequence and the check bit sequence, the step of selecting one or C code blocks to perform the Polar code encoding according to the data characteristic includes: when the length of the position index sequence of the information bit sequence and the check bit sequence is greater than the preset twelfth threshold, selecting C code blocks to perform the Polar code encoding; and when the length of the position index sequence of the information bit sequence and the check bit sequence is less than or equal to the twelfth threshold, selecting one code block to perform the Polar code encoding.

In one embodiment, when the data characteristic of the information bit sequence is the carrier frequency carrying the information bit sequence, the step of selecting one or C code blocks to perform the Polar code encoding according to the data characteristic includes: when the carrier frequency carrying the information bit sequence is less than or equal to the preset thirteenth threshold, selecting C code blocks to perform the Polar code encoding; and when the carrier frequency carrying the information bit sequence is greater than the thirteenth threshold, selecting one code block to perform the Polar code encoding.

In one embodiment, when the data characteristic of the information bit sequence is the aggregation level of the CCE of the information bit sequence and the control information format corresponding to the information bit sequence, the step of selecting one or C code blocks to perform the Polar code encoding according to the data characteristic includes: when the aggregation level of the CCE of the information bit sequence and the control information format corresponding to the information bit sequence satisfy the threshold condition, that is when the aggregation level of the CCE of the information bit sequence is less than or equal to the preset first threshold and the index of the control information format corresponding to the information bit sequence is greater than the eighth threshold, selecting C code blocks to perform the Polar code encoding; when the aggregation level of the CCE of the information bit sequence is greater than the first threshold or when the index of the control information format corresponding to the information bit sequence is less than or equal to the eighth threshold, selecting one code block to perform the Polar code encoding.

In one embodiment, when the data characteristic of the information bit sequence is the aggregation level of the CCE carrying the information bit sequence, the step of selecting the encoding scheme according to the data characteristic of the information bit sequence in the step 100 includes: when the aggregation level of the CCE carrying the information bit sequence is less than or equal to the preset first threshold, selecting the parity-check Polar code encoding; when the aggregation level of the CCE carrying the information bit sequence is greater than the first threshold, selecting the cyclic redundancy check-aided Polar code encoding.

In one embodiment, when the data characteristic of the information bit sequence is the MCS level of the information bit sequence, the step of selecting the encoding scheme according to the data characteristic of the information bit sequence in the step 100 includes: when the MCS level of the information bit sequence is greater than the preset second threshold, selecting the parity-check Polar code encoding; and when the MCS level of the information bit sequence is less than or equal to the second threshold, selecting the cyclic redundancy check-aided Polar code encoding.

In one embodiment, when the data characteristic of the information bit sequence is the working mode of the information bit sequence, the step of selecting the encoding scheme according to the data characteristic of the information bit sequence in the step 100 includes: when the working mode is the in-band mode or the stand alone mode, selecting the parity-check Polar code encoding; when the working mode of the information bit sequence is the out-band mode, selecting the cyclic redundancy check-aided Polar code encoding.

In one embodiment, when the data characteristic of the information bit sequence is the application scenario of the information bit sequence, the step of selecting the encoding scheme according to the data characteristic of the information bit sequence in the step 100 includes: when the application scenario is the enhanced Mobile Broadband scenario, selecting the parity-check Polar code encoding; when the application scenario is the Ultra Reliability Low Latency scenario or the massive Machine Type Communication scenario, selecting the cyclic redundancy check-aided Polar code encoding.

In one embodiment, when the data characteristic of the information bit sequence is the link direction of the information bit sequence, the step of selecting the encoding scheme according to the data characteristic of the information bit sequence in the step 100 includes: when the link direction is the downlink direction from the base station or the relay to the terminal, selecting the parity-check Polar code encoding; when the link direction is the uplink direction from the terminal to the base station or the relay, selecting the cyclic redundancy check-aided Polar code encoding.

In one embodiment, when the data characteristic of the information bit sequence is the type of the user equipment receiving the bit sequence to be transmitted, the step of selecting the encoding scheme according to the data characteristic of the information bit sequence in the step 100 includes: when the index of the type of the user equipment is greater than the preset third threshold, selecting the cyclic redundancy check-aided Polar code encoding; when the index of the type of the user equipment is less than or equal to the third threshold, selecting the parity-check Polar code encoding.

In one embodiment, when the data characteristic of the information bit sequence is the length of the encoded code block, the step of selecting the encoding scheme according to the data characteristic of the information bit sequence in the step 100 includes: when the length of the encoded code block is greater than the preset fourth threshold, selecting the cyclic redundancy check-aided Polar code encoding; when the length of the encoded code block is less than or equal to the fourth threshold, selecting the parity-check Polar code encoding.

In one embodiment, the fourth threshold may be a positive integer which is not less than 200 and not greater than 4000.

In one embodiment, when the data characteristic of the information bit sequence is the length of the information bit sequence, the step of selecting the encoding scheme according to the data characteristic of the information bit sequence in the step 100 includes: when the length of the information bit sequence is greater than the preset fifth threshold, selecting the cyclic redundancy check-aided Polar code encoding; when the length of the information bit sequence is less than or equal to the fifth threshold, selecting the parity-check Polar code encoding.

In one embodiment, the fifth threshold may be a positive integer which is not less than 200 and not greater than 2000.

In one embodiment, when the data characteristic of the information bit sequence is the code rate of the encoded code block, the step of selecting the encoding scheme according to the data characteristic of the information bit sequence in the step 100 includes: when the code rate of the encoded code block is greater than the preset sixth threshold, selecting the parity-check Polar code encoding; when the code rate of the encoded code block is less than or equal to the sixth threshold, selecting the cyclic redundancy check-aided Polar code encoding.

In one embodiment, when the data characteristic of the information bit sequence is the search space, the step of selecting the encoding scheme according to the data characteristic of the information bit sequence in the step 100 includes: when the search space is the UE-specific search space, selecting the parity-check Polar code encoding; when the search space is the common search space, selecting the cyclic redundancy check-aided Polar code encoding.

In one embodiment, when the data characteristic of the information bit sequence is the number of transmissions of the information bit sequence, the step of selecting the encoding scheme according to the data characteristic of the information bit sequence in the step 100 includes: when the number of transmissions of the information bit sequence is less than or equal to the preset seventh threshold, selecting the parity-check Polar code encoding; when the number of transmissions of the information bit sequence is greater than the seventh threshold, selecting the cyclic redundancy check-aided Polar code encoding.

In one embodiment, when the data characteristic of the information bit sequence is the type of the channel carrying the information bit sequence, the step of selecting the encoding scheme according to the data characteristic of the information bit sequence in the step 100 includes: when the type of the channel carrying the information bit sequence is the data channel, selecting the cyclic redundancy check-aided Polar code encoding; when the type of the channel carrying the information bit sequence is the control channel, selecting the parity-check Polar code encoding.

In one embodiment, when the data characteristic of the information bit sequence is the control information format corresponding to the information bit sequence, the step of selecting the encoding scheme according to the data characteristic of the information bit sequence in the step 100 includes: when the index of the control information format corresponding to the information bit sequence is less than or equal to the preset eighth threshold, selecting the parity-check Polar code encoding; when the index of the control information format corresponding to the information bit sequence is greater than the eighth threshold, selecting the cyclic redundancy check-aided Polar code encoding.

In one embodiment, when the data characteristic of the information bit sequence is the CSI process corresponding to the information bit sequence, the step of selecting the encoding scheme according to the data characteristic of the information bit sequence in the step 100 includes: when the value of the CQI in the CSI process is greater than the preset ninth threshold, selecting the parity-check Polar code encoding; when the value of the CQI in the CSI process is less than or equal to the ninth threshold, selecting the cyclic redundancy check-aided Polar code encoding.

In one embodiment, when the data characteristic of the information bit sequence is the scrambling scheme of the information bit sequence, the step of selecting the encoding scheme according to the data characteristic of the information bit sequence in the step 100 includes: when the level of the scrambling scheme of the information bit sequence is greater than the preset tenth threshold, selecting the cyclic redundancy check-aided Polar code encoding; when the level of the scrambling scheme of the information bit sequence is less than or equal to the tenth threshold, selecting the parity-check Polar code encoding.

In one embodiment, when the data characteristic of the information bit sequence is the set of subframes carrying the information bit sequence, the step of selecting the encoding scheme according to the data characteristic of the information bit sequence in the step 100 includes: when the index of the set of subframes is greater than the preset eleventh threshold, selecting the cyclic redundancy check-aided Polar code encoding; when the index of the set of subframes is less than or equal to the eleventh threshold, selecting the parity-check Polar code encoding.

In one embodiment, when the data characteristic of the information bit sequence is the position index sequence of the information bit sequence and the check bit sequence, the step of selecting the encoding scheme according to the data characteristic of the information bit sequence in the step 100 includes: when the length of the position index sequence of the information bit sequence and the check bit sequence is greater than the preset twelfth threshold, selecting the cyclic redundancy check-aided Polar code encoding; when the length of the position index sequence of the information bit sequence and the check bit sequence is less than or equal to the twelfth threshold, selecting the parity-check Polar code encoding.

In one embodiment, when the data characteristic of the information bit sequence is the carrier frequency carrying the information bit sequence, the step of selecting the encoding scheme according to the data characteristic of the information bit sequence in the step 100 includes: when the carrier frequency carrying the information bit sequence is less than or equal to the preset thirteenth threshold, selecting the parity-check Polar code encoding; or when the carrier frequency carrying the information bit sequence is greater than the thirteenth threshold, selecting the cyclic redundancy check-aided Polar code encoding.

In one embodiment, when the data characteristic of the information bit sequence is the aggregation level of the CCE of the information bit sequence and the control information format corresponding to the information bit sequence, the step of selecting the encoding scheme according to the data characteristic of the information bit sequence in the step 100 includes: when the aggregation level of the CCE of the information bit sequence and the control information format corresponding to the information bit sequence satisfy a threshold condition, that is when the aggregation level of the CCE of the information bit sequence is less than or equal to the preset first threshold and the index of the control information format corresponding to the information bit sequence is less than or equal to the eighth threshold, selecting the parity-check Polar code encoding; and when the aggregation level of the CCE of the information bit sequence is greater than the first threshold or when the index of the control information format corresponding to the information bit sequence is greater than the eighth threshold, selecting the cyclic redundancy check-aided Polar code encoding.

The threshold conditions for selecting the Polar code encoding scheme and the number of Polar code blocks may be the same as the threshold conditions for determining the rate matching scheme of the bit sequence to be transmitted.

In the above embodiments, the bit sequence having the length of K bits is encoded using the Polar code to obtain the encoded bit sequence having the length of N bits, and the bit sequence to be transmitted is determined according to the data characteristic, thereby implementing the transmission of a bit sequence of an arbitrary length on the basis of the Polar code encoding and selecting arbitrarily the Polar code encoding scheme and the number of Polar code blocks based on the data characteristic of the information bit sequence.

Figure 2:
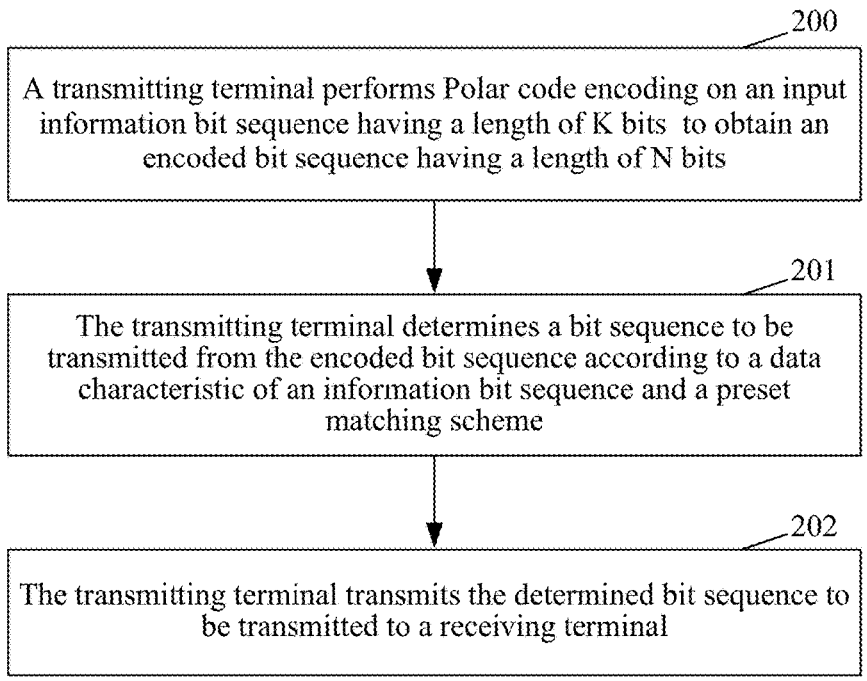
FIG. 2 is a flowchart of another data processing method according to an embodiment of the present disclosure.

One embodiment of the present disclosure further provides a data processing method. The method is applied to a transmitting terminal side. As shown in FIG. 2, the data processing method includes the steps described below.

In step 200, the transmitting terminal performs Polar code encoding on an input information bit sequence having the length of K bits to obtain an encoded bit sequence having the length of N bits.

Alternatively, the step of performing Polar code encoding on an input information bit sequence having the length of K bits to obtain an encoded bit sequence having the length of N bits includes selecting one or C code blocks to perform the Polar code encoding in the Polar code encoding process according to a data characteristic of an information bit sequence, where C is a positive integer greater than 1.

Alternatively, the number of the code blocks $$C = \left\lceil \frac{K_1}{K_{1max}} \right\rceil \text{ or } C = \left\lceil \frac{N}{N_{max}(1+\Delta)} \right\rceil.$$

In the above formula, $K_1$ is the length of the information bit sequence to be transmitted, $K_{1max}$ is the length of a set maximum information bit sequence, and $N_{max}$ is the maximum size of a generation matrix corresponding to the Polar code, where $K_1$, $K_{1max}$ and $N_{max}$ are positive integers, and $0 \le \Delta \le 2$.

The step of selecting one or C code blocks to perform the Polar code encoding in the Polar code encoding process according to the data characteristic of an information bit sequence includes determining to use C code blocks to perform the Polar code encoding if the data characteristic of the information bit sequence satisfies a threshold condition; determining to use one code block to perform the Polar code encoding if the data characteristic of the information bit sequence does not satisfy the threshold condition.

The Polar code encoding in the step 200 includes, but is not limit to, the parity-check Polar code encoding or the cyclic redundancy check-aided Polar code encoding.

Alternatively, before the step 200, the method further includes selecting the parity-check Polar code encoding or the cyclic redundancy check-aided Polar code encoding as the encoding scheme according to the data characteristic of the information bit sequence.

Alternatively, the step of selecting the parity-check Polar code encoding or the cyclic redundancy check-aided Polar code encoding as the encoding scheme according to the data characteristic of the information bit sequence includes: selecting one of the parity-check Polar code encoding or the cyclic redundancy check-aided Polar code encoding if the data characteristic of the information bit sequence satisfies the threshold condition; and selecting the other one if the data characteristic of the information bit sequence does not satisfy the threshold condition.

Alternatively, the step of performing Polar code encoding on a bit sequence having the length of K bits to obtain an encoded bit sequence having the length of N bits includes: performing Polar code encoding on the input bit sequence have the length of K bits to obtain the encoded bit sequence having the length of N bits according to a Polar code generation matrix.

In step 201, the transmitting terminal determines a bit sequence to be transmitted from the encoded bit sequence according to the data characteristic of the information bit sequence and a predetermined rate matching scheme.

The step 201 may include determining a rate matching scheme of the bit sequence to be transmitted from a plurality of predetermined rate matching schemes according to the data characteristic of the information bit sequence; and selecting R bits from the encoded bit sequence as the bit sequence to be transmitted according to the determined rate matching scheme, where R is a positive integer greater than or equal to K.

In one embodiment, the step of determining a rate matching scheme of the bit sequence to be transmitted from a plurality of predetermined rate matching schemes according to the data characteristic of the information bit sequence includes determining one rate matching scheme or a combination of multiple rate matching schemes from the plurality of predetermined rate matching schemes as the rate matching scheme of the bit sequence to be transmitted if the data characteristic of the information bit sequence satisfies the threshold condition; or determining one rate matching scheme or a combination of multiple rate matching schemes from the remaining of the plurality of predetermined rate matching schemes as the rate matching scheme of the bit sequence to be transmitted if the data characteristic of the information bit sequence does not satisfy the threshold condition.

Alternatively, the data characteristic of the information bit sequence includes any one or any combination of characteristics described in the above embodiments.

In step 202, the transmitting terminal transmits the determined bit sequence to be transmitted to a receiving terminal.

For the description of selecting the rate matching scheme, the number of code blocks and the encoding scheme according to the data characteristic, reference may be made to the related description in the above embodiments, and thus no further details are provided herein. For the specific implementation process of each step, reference may be made to the related description in the above embodiments, and thus no further details are provided herein.

Figure 3:
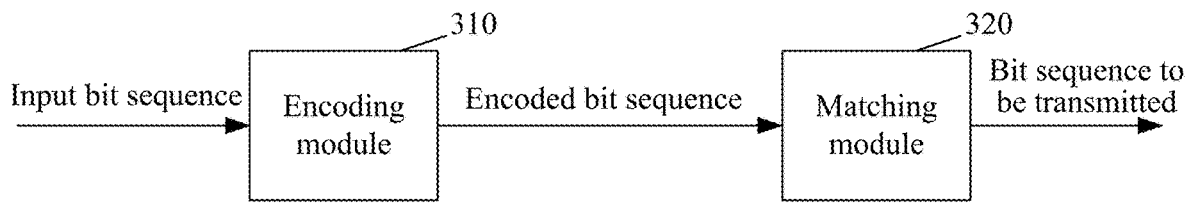
FIG. 3 is a structural diagram of a data processing device according to an embodiment of the present disclosure.

FIG. 3 is a structural diagram of a data processing device according to an embodiment of the present disclosure. The data processing device may be applied to the transmitting terminal side and is configured to transmit a determined bit sequence to a receiving terminal. As shown in FIG. 3. the data processing device includes an encoding module 310 and a matching module 320.

The encoding module 310 is configured to perform Polar code encoding on an input bit sequence having the length of K bits to obtain an encoded bit sequence having the length of N bits. K is a positive integer and N is a positive integer greater than or equal to K.

The matching module 320 is configured to determine a bit sequence to be transmitted from the encoded bit sequence according to a data characteristic of an information bit sequence and a predetermined rate matching scheme.

Alternatively, the input bit sequence having the length of K bits may include one of: an information bit sequence; an information bit sequence and a check bit sequence; an information bit sequence and a predetermined bit sequence; or an information bit sequence, a check bit sequence and a predetermined bit sequence.

Alternatively, the check bit sequence is obtained by encoding the information bit sequence and the predetermined bit sequence, or the check bit sequence is obtained by encoding the information bit sequence.

Alternatively, the encoding method includes, but is not limit to, parity check encoding, cyclic redundancy check encoding, BCH encoding, Hamming code encoding, convolutional encoding, generation matrix encoding, Turbo encoding, low-density parity-check encoding, Reed Muller encoding and Hash encoding. Optionally, the encoding method is any combination of encoding schemes described above or performing one of the encoding methods for one or more times.

Alternatively, the predetermined bit sequence includes, but is not limited to, an all-zeroes bit sequence, an all-ones bit sequence, or a pseudo random sequence composed of 0s and 1s. Alternatively, the predetermined bit sequence may be any combination of the above forms.

Alternatively, the encoding module 310 is configured to perform Polar code encoding on the input information bit sequence having the length of K bits through the following method: selecting one or C code blocks as the encoded bit sequence in the Polar code encoding process according to the data characteristic of the information bit sequence, where C is a positive integer greater than 1.

The number of the code blocks $$C = \left\lceil \frac{K_1}{K_{1max}} \right\rceil \text{ or } C = \left\lceil \frac{N}{N_{max}(1+\Delta)} \right\rceil.$$

In the above formula, $K_1$ is the length of the information bit sequence to be transmitted, $K_{1max}$ is the length of a set maximum information bit sequence, and $N_{max}$ is the maximum size of a generation matrix corresponding to the Polar code, where $K_1$, $K_{1max}$ and $N_{max}$ are positive integers, and $0 \leq \Delta \leq 2$.

Alternatively, the encoding module 310 is configured to select the code block through the following method: determining to use C code blocks to perform the Polar code encoding if the data characteristic of the information bit sequence satisfies a threshold condition; and determining to use one code block to perform the Polar code encoding if the data characteristic of the information bit sequence does not satisfy the threshold condition.

Alternatively, the Polar code encoding includes parity-check Polar code encoding or cyclic redundancy check-aided Polar code encoding.

Alternatively, the encoding module 310 is further configured to select the parity-check Polar code encoding or the cyclic redundancy check-aided Polar code encoding as the encoding scheme according to the data characteristic.

Alternatively, the encoding module 310 is further configured to determine to use one of the parity-check Polar code encoding and the cyclic redundancy check-aided Polar code encoding if the data characteristic of the information bit sequence satisfies the threshold condition; and determine to use the other one if the data characteristic of the information bit sequence does not satisfy the threshold condition.

Alternatively, the matching module 320 is configured to determine a rate matching scheme of the bit sequence to be transmitted from a plurality of predetermined rate matching schemes according to the data characteristic of the information bit sequence; and select R bits from the encoded bit sequence as the bit sequence to be transmitted according to the determined rate matching scheme, where R is a positive integer greater than or equal to K.

In one embodiment, the step of determining a rate matching scheme of the bit sequence to be transmitted from a plurality of predetermined rate matching schemes according to the data characteristic of the information bit sequence includes: determining one or a combination of multiple ones from the plurality of predetermined rate matching schemes as the rate matching scheme of the bit sequence to be transmitted if the data characteristic of the information bit sequence satisfies the threshold condition; and determining one or a combination of multiple ones from the remaining part of the plurality of predetermined rate matching schemes as the rate matching scheme of the bit sequence to be transmitted if the data characteristic of the information bit sequence does not satisfy the threshold condition.

For the description of the selection of the number of code blocks, the encoding scheme and the rate matching scheme, reference may be made to the related description in the above embodiments, and thus no further details are provided herein.

According to the data processing method and device in the above embodiments, the Polar code encoding is performed on a bit sequence having the length of K bits to obtain an encoded bit sequence having the length of N bits, and a bit sequence to be transmitted is determined from the encoded bit sequence according to a data characteristic, thereby implementing the transmission of bit sequences of an arbitrary length on the basis of the Polar code encoding.

One embodiment of the present disclosure provides user equipment (UE) which is provided with the data processing device in any embodiment described above.

One embodiment of the present disclosure provides a base station which is provided with the data processing device in any embodiment described above.

The method in the above embodiments will be described below in detail in conjunction with examples.

The present embodiment may be, but is not limited to, applied in the new radio access technology (NR).

In the present embodiment, the transmitting terminal may be the base station, where the base station may be, but is not limited to, a g Node B (gNB). The transmitting terminal may also be UE. In the present embodiment, the receiving terminal may be UE or a base station, where the base station may be, but is not limited to, the gNB.

In the present embodiment, the transmitting terminal has one bit sequence, that is the input information bit sequence. The transmitting terminal performs Polar code encoding on the input information bit sequence.

The Polar code encoding method may include the parity-check Polar code encoding or the cyclic redundancy check-aided Polar code encoding. The transmitting terminal needs to select a proper codding method according to the data characteristic of the information bit sequence and a preset threshold condition. The number of code blocks used in the Polar code encoding also needs to be determined according to the data characteristic of the information bit sequence and the preset threshold condition.

The selection of the Polar code encoding scheme, the selection of the number of code blocks, and the selection of the rate matching scheme are independent from each other.

The process of selecting R bits from the N-bit encoded bit sequence obtained by means of the Polar code encoding as the bit sequence to be transmitted requires rate matching. In the present embodiment, the data characteristic of the information bit sequence may be the aggregation level of the CCE carrying the information bit sequence. The aggregation level may be T1, and the preset first threshold may be E1 bits, where T1 and E1 are positive integers. The step of determining the rate matching scheme of the bit sequence to be transmitted in the step 101 is as follows.

When $T1 \leq E1$, the rate matching scheme to be adopted may be the second rate matching scheme, the third rate matching scheme, the fifth rate matching scheme, the eighth rate matching scheme, the tenth rate matching scheme, the seventh rate matching scheme, the ninth rate matching scheme or the eleventh rate matching scheme. When $T1 > E1$, the rate matching scheme to be adopted may be the first rate matching scheme, the fourth rate matching scheme or the sixth rate matching scheme. The value of E1 is one selected from $\{1, 2, 4, 8\}$. For example, E1 equals to 2.

One embodiment of the present disclosure further provides a computer-readable storage medium configured to store computer-executable instructions for executing the encoding method and/or the data processing method described above.

One embodiment of the present disclosure further provides a device for implementing the data processing method. The device may include a memory and a processor configured to execute executable instructions stored in the memory.

In one embodiment, the memory stores the following executable instruction for: performing Polar code encoding on the input bit sequence having the length of K bits to obtain the encoded bit sequence having the length of N bits, and determining the bit sequence to be transmitted from the encoded bit sequence according to the data characteristic of the information bit sequence and the predetermined rate matching scheme, where K is a positive integer and N is a positive integer greater than or equal to K.

In one embodiment, the memory stores the Polar code generation matrix and the following executable instruction for: performing Polar code encoding on the input bit sequence having the length of K bits to obtain the encoded bit sequence having the length of N bits, and determining the bit sequence to be transmitted from the encoded bit sequence according to the data characteristic of the information bit sequence and the predetermined rate matching scheme, where K is a positive integer and N is a positive integer greater than or equal to K.

The serial numbers of the above embodiments of the present disclosure are merely for ease of description and do not indicate superiority and inferiority of the embodiments. From the description of the implementation modes described above, it will be apparent to those skilled in the art that the method in the embodiments described above may be implemented by software plus a necessary general-purpose hardware platform, or may of course be implemented by hardware. However, in many cases, the former is a preferred implementation mode. Based on this understanding, the solutions provided by the present disclosure substantially, or the part contributing to the existing art, may be embodied in the form of a software product. The computer software product is stored in a storage medium (such as an ROM/RAM, a magnetic disk or an optical disk) and includes several instructions for enabling a terminal device (which may be a mobile phone, a computer, a server, a network device, and the like) to execute the method according to each embodiment of the present disclosure.

INDUSTRIAL APPLICABILITY

According to the data processing method and device in the present disclosure, the Polar code encoding is performed on a bit sequence having the length of K bits to obtain an encoded bit sequence having the length of N bits, and a bit sequence to be transmitted is determined from the encoded bit sequence according to a data characteristic, thereby implementing the transmission of bit sequences of arbitrary lengths on the basis of the Polar code encoding.

What is claimed is:

1. A method of wireless communication, comprising:
determining, by a processor, a polar code encoding method according to data characteristic of an information bit sequence, the data characteristic of the information bit sequence comprising a bit length value of the information bit sequence and a channel type for carrying the information bit sequence,
wherein the polar code encoding method comprises a parity-check polar code encoding or a cyclic redundancy check-aided polar code encoding,
wherein in a first case that the bit length value satisfies a first condition and the channel type for carrying the information bit sequence satisfies a second condition, the parity-check polar code encoding is selected,
wherein the bit length value satisfies the first condition when the bit length value is less than or equal to a threshold value, and the bit length value fails to satisfy the first condition when the bit length value greater than the threshold value, and
wherein the channel type satisfies the second condition when the channel type is a control channel, and the channel type fails to satisfy the second condition when the channel type is a data channel;
performing, by the processor, the polar code encoding method on an input bit sequence having a K bit length to obtain an encoded bit sequence having a N bit length, wherein K is a positive integer, and N is a positive integer greater than or equal to K;
determining, by the processor, a bit sequence to be transmitted from the encoded bit sequence; and
transmitting, to a receiver, a message comprising the bit sequence.

2. The method according to claim 1, wherein the data characteristic of the information bit sequence further comprises:
a link direction of the information bit sequence.

3. The method according to claim 1, wherein in a second case that at least one of the bit length value fails to satisfy the first condition or the channel type for carrying the information bit sequence fails to satisfy the second condition, the cyclic redundancy check-aided polar code encoding is selected.

4. An apparatus for wireless communication, comprising:
a processor and memory containing executable instructions that when executed perform at least:
determining a polar code encoding method according to data characteristic of an information bit sequence, the data characteristic of the information bit sequence comprising a bit length value of the information bit sequence and a channel type for carrying the information bit sequence,
wherein the polar code encoding method comprises a parity-check polar code encoding or a cyclic redundancy check-aided polar code encoding,
wherein in a first case that the bit length value satisfies a first condition and the channel type for carrying the information bit sequence satisfies a second condition, the parity-check polar code encoding is selected,
wherein the bit length value satisfies the first condition when the bit length value is less than or equal to a threshold value, and the bit length value fails to satisfy the first condition when the bit length value greater than the threshold value, and
wherein the channel type satisfies the second condition when the channel type is a control channel, and the channel type fails to satisfy the second condition when the channel type is a data channel;
performing the polar code encoding method on an input bit sequence having a K bit length to obtain an encoded bit sequence having a N bit length, wherein K is a positive integer, and N is a positive integer greater than or equal to K;
determining, from the encoded bit sequence, a bit sequence to be transmitted; and
transmitting, to a receiver, a message comprising the bit sequence.

5. The apparatus according to claim 4, wherein the data characteristic of the information bit sequence further comprises:
a link direction of the information bit sequence.

6. The apparatus according to claim 4, wherein in a second case that at least one of the bit length value fails to satisfy the first condition or the channel type for carrying the information bit sequence fails to satisfy the second condition, the cyclic redundancy check-aided polar code encoding is selected.

7. A non-transitory storage medium having code stored thereon, the code upon execution by a processor, causing the processor to implement a method of wireless communication comprising:
determining a polar code encoding method according to data characteristic of an information bit sequence, the data characteristic of the information bit sequence comprising a bit length value of the information bit sequence and a channel type for carrying the information bit sequence,
wherein the polar code encoding method comprises a parity-check polar code encoding or a cyclic redundancy check-aided polar code encoding,
wherein in a first case that the bit length value satisfies a first condition and the channel type for carrying the information bit sequence satisfies a second condition, the parity-check polar code encoding is selected, wherein the bit length value satisfies the first condition when the bit length value is less than or equal to a threshold value, and the bit length value fails to satisfy the first condition when the bit length value greater than the threshold value, and wherein the channel type satisfies the second condition when the channel type is a control channel, and the channel type fails to satisfy the second condition when the channel type is a data channel;

performing the polar code encoding method on an input bit sequence having a K bit length to obtain an encoded bit sequence having a N bit length, wherein K is a positive integer, and N is a positive integer greater than or equal to K;

determining, from the encoded bit sequence, a bit sequence to be transmitted; and transmitting, to a receiver, a message comprising the bit sequence.

8. The non-transitory storage medium according to claim 7, wherein the data characteristic of the information bit sequence further comprises:

a link direction of the information bit sequence.

9. The non-transitory storage medium according to claim 7, wherein in a second case that at least one of the bit length value fails to satisfy the first condition or the channel type for carrying the information bit sequence fails to satisfy the second condition, the cyclic redundancy check-aided polar code encoding is selected.

* * * * *